(12) United States Patent
Thompson

(10) Patent No.: US 8,264,297 B2
(45) Date of Patent: Sep. 11, 2012

(54) BALUN SIGNAL SPLITTER

(75) Inventor: Philip H Thompson, Solon, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 302 days.

(21) Appl. No.: 12/671,332

(22) PCT Filed: Aug. 29, 2008

(86) PCT No.: PCT/US2008/074756
§ 371 (c)(1),
(2), (4) Date: Jan. 29, 2010

(87) PCT Pub. No.: WO2009/029768
PCT Pub. Date: Mar. 5, 2009

(65) Prior Publication Data
US 2010/0194493 A1    Aug. 5, 2010

Related U.S. Application Data

(60) Provisional application No. 60/966,712, filed on Aug. 29, 2007.

(51) Int. Cl.
*H03H 5/00* (2006.01)
*H01P 5/12* (2006.01)

(52) U.S. Cl. .............. 333/124; 333/25; 333/26; 333/32; 333/129; 333/132

(58) Field of Classification Search .................... 333/25, 333/26, 32, 124, 129, 132
See application file for complete search history.

(56) References Cited

U.S. PATENT DOCUMENTS

| | | | | |
|---|---|---|---|---|
| 5,347,245 | A * | 9/1994 | Wright, Jr. | ................... 333/131 |
| 6,806,790 | B2 * | 10/2004 | Ji | .................................. 333/119 |
| 2005/0212619 | A1 | 9/2005 | Aigner et al. | |

* cited by examiner

*Primary Examiner* — Robert Pascal
*Assistant Examiner* — Kimberly Glenn
(74) *Attorney, Agent, or Firm* — Lando & Anastasi, LLP

(57) ABSTRACT

A balun signal splitter for use in transceiver systems, such as wireless communications systems, including a wide-band balun with a secondary winding for signal splitting between two operating bands (e.g., high-band and low-band) or modes. An example of a balun signal splitter configured for dual-band or dual-mode operation or includes a balun having a primary winding and a secondary winding, the secondary winding having a first port and a second port, a first network coupled to the first port and configured to present a short circuit impedance at the first port at out-of-band frequencies or during out-of-mode operation, and a second network coupled to the second port and configured to present a short circuit impedance at the second port at out-of-band frequencies or during out-of-mode operation.

23 Claims, 4 Drawing Sheets

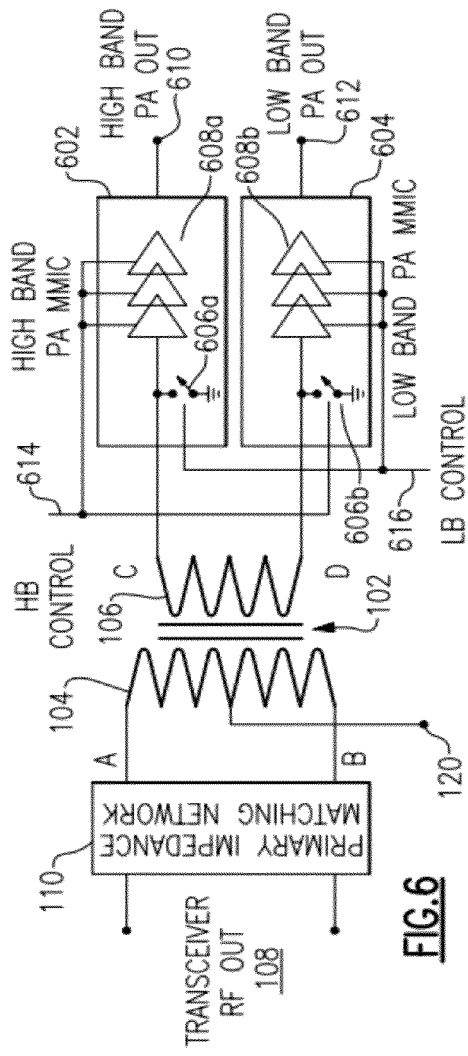
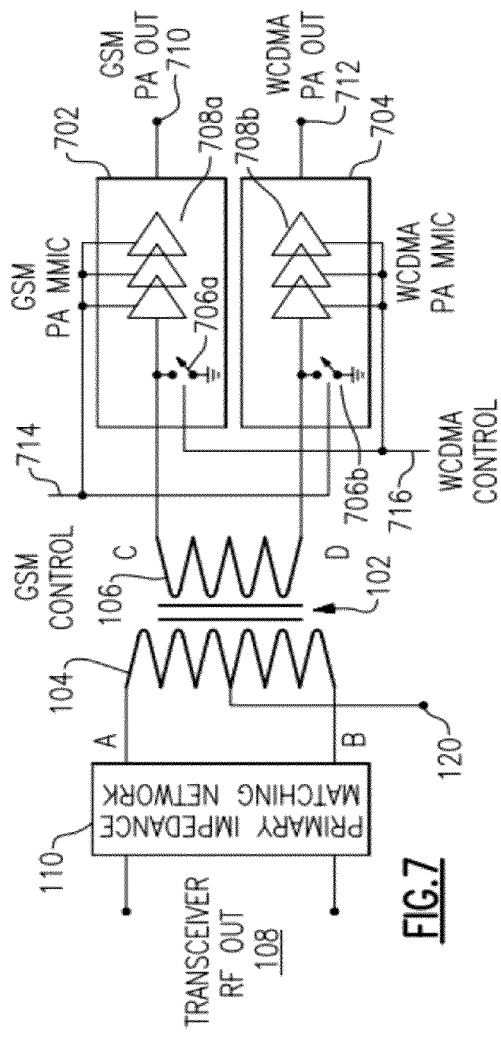
FIG.6
FIG.7

US 8,264,297 B2

BALUN SIGNAL SPLITTER

CROSS REFERENCE TO RELATED APPLICATIONS

This application claims priority under 35 U.S.C. §119(e) to U.S. Provisional Application No. 60/966,712 filed Aug. 29, 2007 and entitled "Balun Signal Splitter for Wireless Communications Systems," which is incorporated herein by reference in its entirety.

BACKGROUND

1. Field of Invention

The present invention relates generally to the field of wireless communication systems and, more particularly, to electronic circuits in wireless communication systems.

2. Discussion of Related Art

Wireless communications systems generally have separate high-band and low-band interfaces, or in the case of multi-mode systems, separate mode interfaces, between the transceiver transmitter output and the inputs of the power amplifier. For example, a dual-mode wireless communication system would have separate interfaces for the GMSK/EDGE (Gaussian Minimum Shift Keying/Enhanced Data Rates for GSM Evolution) mode and the WCDMA (Wideband Code-Division Multiple Access) mode. If the interfaces are differential, then for a dual-band or dual-mode system, four different radio frequency (RF) routes and two RF baluns are required.

As known to those skilled in the art, a balun is a passive electronic device that converts between balanced and unbalanced electrical signals and which may also change impedance. The function of the balun is to achieve compatibility between different systems within the wireless communication system or network. Accordingly, they are widely used in many different applications including mobile telephone networks, radio systems, television systems, radars, and the like. For example, in television, radio and other antenna installations, baluns are used to convert between 300 Ohm ribbon cable (balanced) and 75 Ohm coaxial cable (unbalanced) or to directly connect a balanced antenna to an unbalanced coaxial cable. Similarly, in electronic communications systems, baluns are used to convert Twinax cables to Category 5 or 6 cables, and back, or to convert between coaxial cable and ladder line. Baluns involve some form of electromagnetic coupling to achieve the conversion, and therefore, are commonly implemented using transformers.

SUMMARY OF INVENTION

Aspects and embodiments of the present invention are directed to a balun signal splitter for use in transceiver systems, such as wireless communications systems. As discussed below, by using a wideband balun with a secondary winding for signal splitting between two operating bands (e.g., high-band and low-band) or modes, a balun signal splitter according to various aspects and embodiments can result in reduced transceiver RF I/O and routing. The balun signal splitter may be integrated, for example, in a front end module of a communications system.

According to one embodiment, a balun signal splitter configured for high-band and low-band operation comprises a balun including a primary winding and a secondary winding, each having a first port and a second port, a high-band network coupled to the first port of the secondary winding and configured to present a short circuit impedance at the first port of the secondary winding at low-band frequencies, and a low-band network coupled to the second port of the secondary winding and configured to present a short circuit impedance at the second port of the secondary winding at high-band frequencies.

In one example, at least one of the high-band network and the low-band network comprises a resonant circuit including an inductance coupled between a first capacitance and a second capacitance. In another example, at least one of the high-band network and the low-band network comprises a delay line coupled to an interstage filter. The delay line may be configured to transform an out-of-band impedance of the interstage filter to a short circuit. In one example, the high-band frequencies include frequencies in the range of 1710 MHz to 1910 MHz. In another example, the low-band frequencies include frequencies in the range of 820 MHz to 915 MHz. The balun signal splitter may further comprise a primary impedance matching network coupled to the first and second ports of the primary winding of the balun. This primary impedance matching network may be a passive network. In one example, the primary impedance matching network is configured to present a high-Z real differential impedance at the first and second ports of the primary winding.

Another embodiment is directed to an RF interface for a transceiver, the RF interface comprising an embodiment of the balun signal splitter discussed above, a differential transceiver RF output terminal coupled to the primary winding of the balun, a first power amplifier input terminal, and a second power amplifier input terminal. The high-band network is coupled between the first port of the secondary winding and the first power amplifier input terminal, and the low-band network is coupled between the second port of the secondary winding and the second power amplifier input terminal. In one example, the transceiver is incorporated into a dual-band communications system. In one example, the dual-band communications system is one of a dual-band WCDMA communications system and a dual-band GSM communications system.

According to another embodiment, a balun signal splitter configured for at least two operating states comprises a balun including a primary winding and a secondary winding, each having a first port and a second port, a first network coupled to the first port of the secondary winding and configured to present a short circuit impedance at the first port of the secondary winding for a first operating state, and a second network coupled to the second port of the secondary winding and configured to present a short circuit impedance at the second port of the secondary winding for a second operating state. In one example, the at least two operating states includes at least two operating frequency bands, and the first operating state is high-band operation and the second operating state is low-band operation. In another example, the at least two operating states includes a GSM mode and a WCDMA mode.

According to another embodiment, a balun signal splitter configured for dual-mode operation comprises a balun including a primary winding and a secondary winding, each having a first port and a second port, a first network coupled to the first port of the secondary winding and configured to present a short circuit impedance at the first port of the secondary winding for a first mode of operation, and a second network coupled to the second port of the secondary winding and configured to present a short circuit impedance at the second port of the secondary winding for a second mode of operation.

In one example, the first mode of operation is a GSM mode and the second mode of operation is a WCDMA mode. In one example, at least one of the first network and the second network comprises a delay line coupled to an interstage filter. The delay line may be configured to transform an out-of-mode impedance of the interstage filter to a short circuit. The balun signal splitter may further comprise a primary impedance matching network coupled to the first and second ports of the primary winding of the balun. In one example, the primary impedance matching network is a passive network. In another example, the primary impedance matching network is configured to present a high-Z real differential impedance at the first and second ports of the primary winding.

In another embodiment, an RF interface for a transceiver comprises an embodiment of the balun signal splitter discussed above, a differential transceiver RF output terminal coupled to the primary winding of the balun, a first power amplifier input terminal, and a second power amplifier input terminal. The first network is coupled between the first port of the secondary winding and the first power amplifier input terminal, and the second network is coupled between the second port of the secondary winding and the second power amplifier input terminal.

Another embodiment is directed to an RF interface for a transceiver for a wireless communications system. The RF interface comprises a differential transceiver output terminal, a balun including a primary winding having first and second primary ports coupled to the differential transceiver output terminal and a secondary winding having first and second secondary ports, first and second power amplifier input terminals, a high-band network electrically coupled between the first secondary port and the first power amplifier input terminal, the high-band network configured to present a short circuit out-of-band impedance at the first port, and a low-band network electrically coupled between the second secondary port and the second power amplifier input terminal, the low-band network configured to present a short circuit out-of-band impedance at the second port.

In another embodiment of an RF interface for a transceiver for a wireless communications system, the RF interface comprises a differential transceiver output terminal, a balun including a primary winding having first and second primary ports coupled to the differential transceiver output terminal and a secondary winding having first and second secondary ports, first and second power amplifier input terminals, a GSM network electrically coupled between the first secondary port and the first power amplifier input terminal, the GSM network configured to present a short circuit out-of-mode impedance at the first port, and a WCDMA network electrically coupled between the second secondary port and the second power amplifier input terminal, the WCDMA network configured to present a short circuit out-of-mode impedance at the second port.

Still other aspects, embodiments, and advantages of these exemplary aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. Any embodiment disclosed herein may be combined with any other embodiment in any manner consistent with the objects, aims, and needs disclosed herein, and references to "an embodiment," "some embodiments," "an alternate embodiment," "various embodiments," "one embodiment" or the like are not necessarily mutually exclusive and are intended to indicate that a particular feature, structure, or characteristic described in connection with the embodiment may be included in at least one embodiment. The appearances of such terms herein are not necessarily all referring to the same embodiment. The accompanying drawings are included to provide illustration and a further understanding of the various aspects and embodiments, and are incorporated in and constitute a part of this specification. The drawings, together with the remainder of the specification, serve to explain principles and operations of the described and claimed aspects and embodiments.

BRIEF DESCRIPTION OF THE DRAWINGS

Various aspects of at least one embodiment are discussed below with reference to the accompanying figures, which are not intended to be drawn to scale. Where technical features in the figures, detailed description or any claim are followed by references signs, the reference signs have been included for the sole purpose of increasing the intelligibility of the figures, detailed description, and claims. Accordingly, neither the reference signs nor their absence are intended to have any limiting effect on the scope of any claim elements. In the figures, each identical or nearly identical component that is illustrated in various figures is represented by a like numeral. For purposes of clarity, not every component may be labeled in every figure. The figures are provided for the purposes of illustration and explanation and are not intended as a definition of the limits of the invention. In the figures:

FIG. 6 is a block diagram of another example of an RF interface including an RF balun signal splitter according to aspects of the invention;

FIG. 7 is a block diagram of another example of an RF interface including an RF balun signal splitter according to aspects of the invention.

DETAILED DESCRIPTION

Figure 1:
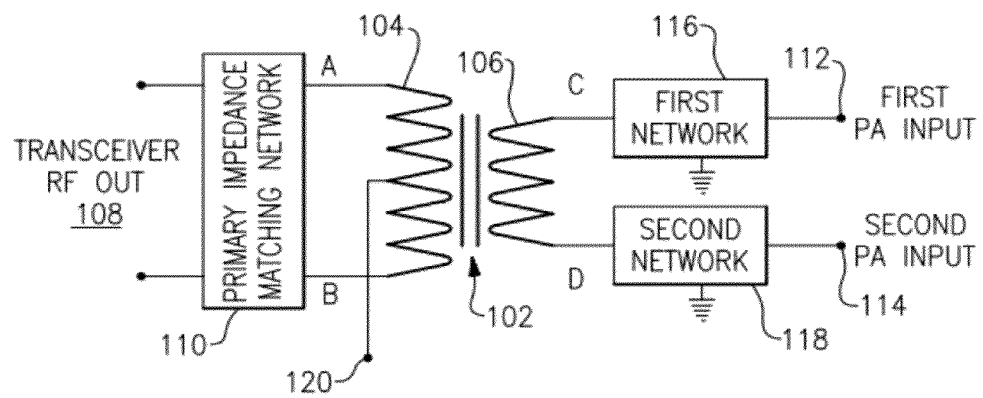
FIG. 1 is a block diagram of one example of an RF interface including an RF balun signal splitter according to aspects of the invention.

Many modern communications systems are multi-band and/or multi-mode systems to accommodate the variety of current operating protocols and frequency bands. For example, a multi-mode transceiver may accommodate various communications standards, such as GSM (Global System for Mobility), GMSK, GSM/EDGE, WCMDA (Wideband Code Division Multiple Access) as well as combinations of these standards. In addition, various communications standards are dual-band. For example, GSM currently uses two operating frequency bands and therefore, current GSM systems have high-band and low-band outputs. Presently preferred interfaces between the transceiver output and the power amplifier inputs in communications systems include differential, high-Z, open collector interfaces as these interfaces provide superior drive levels with relatively low current consumption, as well as good noise rejection and second order spurious signal rejection. However, in conventional multi-mode, multi-band systems, the use of differential interfaces undesirably increases the transceiver I/O pin count.

Aspects and embodiments are directed to a transceiver interface using a wideband balun to split the RF signal from the transceiver into multiple outputs, thereby allowing for reduced RF I/O and routing. Embodiments of a balun signal splitter according to aspects of the invention can enable one wideband differential transceiver output to drive multiple power amplifier inputs through a common RF interface, such as, for example, both high-band and low-band power amplifier inputs or both a GMSK/EDGE power amplifier input and a WCDMA power amplifier input. Accordingly, for a dual-band, differential interface system, the number of RF routes may be reduced from four (discussed above) to two, and the number of baluns may be reduced from two to one. Thus, benefits of the balun signal splitter may include reduced area for routing and placement or integration of baluns, resulting in smaller transceiver die area and reduced package size. These reductions may in turn reduce package complexity and manufacturing cost. The balun signal splitter may also be used to provide the DC bias commonly required with open collector or open drain transceiver output drivers, as discussed further below.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments. Also, the phraseology and terminology used herein is for the purpose of description and should not be regarded as limiting. Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, and upper and lower are intended for convenience of description, not to limit the present systems and methods or their components to any one positional or spatial orientation.

Referring to FIG. 1, there is illustrated a diagram of one example of a balun signal splitter providing an RF interface between a transceiver RF output and power amplifier inputs. In the illustrated example, the balun splitter includes a balun 102 which is a transformer-implemented RF balun including a primary winding 104 and a secondary winding 106. A differential transceiver output is coupled to the balanced primary winding 104 via a primary impedance matching network 110. In one example, the balanced primary winding 104 of the balun 102 is used to terminate an open drain or open collector transceiver output 108. The secondary winding 106 of the balun 102 is used to split the signal between two transmit bands (for example, a high frequency band and a low frequency band) or between two different operating modes (for example, between a GMSK/EDGE mode and a WCDMA mode) to drive first and second power amplifier inputs 112, 114, respectively. First and second networks 116, 118, respectively can be used to terminate the secondary winding, as discussed further below. A center tap 120 on the primary winding 104 may be used to provide bias to the transceiver driver collector, and collector modulation of the transceiver output.

According to one embodiment, the first and second networks 116, 118 are designed using active or passive networks to terminate the secondary winding 106 to provide the desired different band or different mode signals to the first and second power amplifier inputs 112, 114, respectively. For example, consider a dual-band system in which the first input 112 is a high-band input and the second input 114 is a low-band input. In this example, the first and second networks 116, 118 can be designed to provide a short circuit impedance at the high-band frequency on the low-band secondary winding port D and a short circuit impedance at the low-band frequency on the high-band secondary winding port C. Thus, out-of-band signals at each port C and D may be shunted to ground or filtered out of the signal provided at the respective power amplifier inputs 112, 114. Similarly, in a dual-mode example, the networks 116, 118 can be designed to provide a short circuit impedance for "out-of mode" operation. For example, the networks 116, 118 can be designed to provide a short circuit impedance at the GMSK/EDGE port of the secondary winding when the system is operating in the WCDMA mode, and a short circuit impedance at the WCDMA port of the secondary winding when the system is operating in the GMSK/EDGE mode. Termination of the balun secondary winding using the networks 116, 118 advantageously allows for high-band and low-band selection, or mode selection, without the use of series switches.

Figure 2:
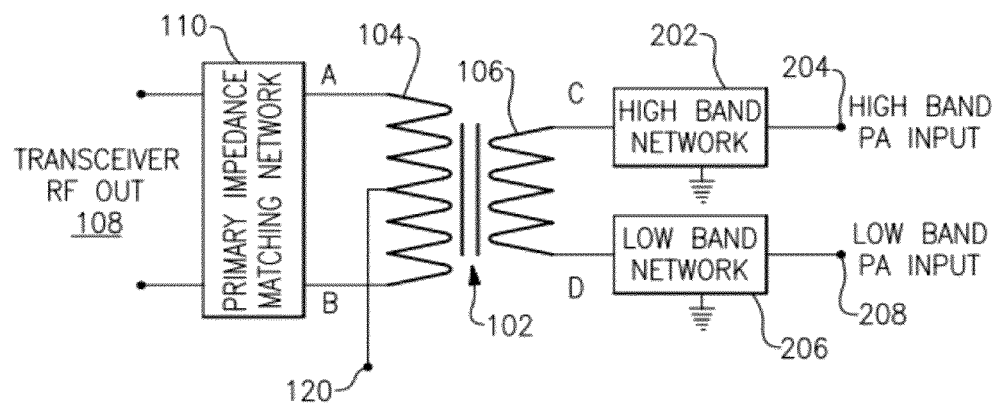
FIG. 2 is a block diagram of one example of a dual-band RF interface including an RF balun signal splitter according to aspects of the invention.

Referring to FIG. 2, there is illustrated an example of a dual-band balun signal splitter. In this example, port C of the secondary winding 106 of the signal balun splitter 102 is terminated through a high-band network 202 for coupling to a high-band power amplifier input 204. Similarly, port D of the secondary winding 106 of the signal balun splitter 102 is terminated through a low-band network 206 for coupling to a low-band power amplifier input 208. Such a dual-band balun signal splitter may be used, for example, in a dual-band GSM transceiver system or a dual-band WCDMA system.

Figure 3:
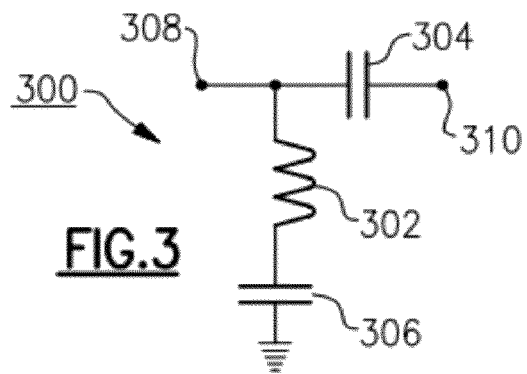
FIG. 3 is a schematic circuit diagram of one example of a filtering network which may be used in the RF interface of FIG. 2.

According to one embodiment, in a dual-band GSM system, the high-band and low-band filtering networks 202, 206 can be implemented as passive series resonant circuits, as illustrated in FIG. 3. The resonant circuit 300 includes an inductance 302 coupled between two capacitors 304, 306. The values of the inductance 302 and the two capacitors 304, 306 may be selected such that the circuit is resonant at a desired frequency, and therefore provides a short circuit impedance to signals at or near that resonant frequency. It is to be appreciated that although the inductance 302 and capacitors 304, 306 are illustrated as single, discrete elements, the invention is no so limited and any of the inductance and capacitors may be implemented as single or multiple devices in any of numerous ways, as known to those skilled in the art. In use, the resonant circuit 300 would be connected such that the input 308 is connected to one of the secondary winding ports C and D, and the output 310 is connected to a corresponding one of the power amplifier inputs 204 and 208.

Current GSM systems use a high-band frequency range of about 1710 MHz to about 1910 MHz and a low-band frequency range of about 820 MHz to about 915 MHz. Accordingly, in one example, for the high-band filtering network 202, the values of the inductance 302 and capacitors 304, 306 may be selected so as to form a series resonant circuit with a center resonance frequency of about 900 MHz. The high-band network 202 may pass signals in the range of about 1710 MHz to 1910 MHz and present a short circuit low-band termination at port C of the secondary winding 106. Similarly, for the low-band filtering network 206, the values of the inductance 302 and capacitors 304, 306 may be selected so as to form a series resonant circuit with a center resonance frequency of about 1800 MHz. The low-band network 206 may pass signals in the range of about 820 MHz to 915 MHz and present a short circuit high-band termination at port D of the secondary winding 106.

Figure 4:
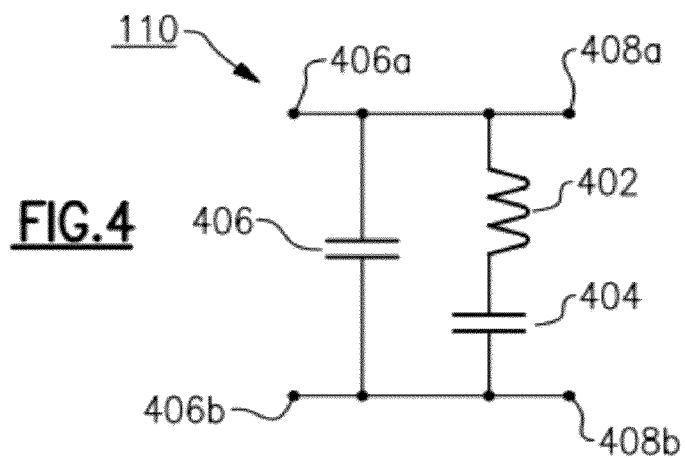
FIG. 4 is a schematic circuit diagram of one example of a primary impedance matching network which may be used in the RF interface of FIG. 1 or 2.

Referring again to FIGS. 1 and 2, the primary impedance matching network 110 may be used to present a high-Z real differential impedance at the ports (A and B) of the primary winding 104. In one embodiment, the primary impedance matching network 110 is configured to present a high-Z real differential impedance over both frequency bands in a dual-band system. For example, in the GSM example discussed above, the primary impedance matching network 110 is configured to present a high-Z real differential impedance at both 900 MHz (for the low band) and 1800 MHz (for the high band). Referring to FIG. 4, there is illustrated one example of a primary impedance matching network 110. In the illustrated example, the primary impedance matching network 110 is implemented as a passive network including an inductance 402 coupled in series with a capacitor 404 and a second capacitor 406 coupled in parallel with the combination of the inductance 402 and capacitor 404. The values of the inductance 402 and the two capacitors 404, 406 may be selected such that the circuit presents a high-Z real impedance over one or more desired frequency bands. In one example, the primary impedance matching network 110 is connected in the balun signal splitter such that the inputs 406a and 406b are connected to the differential transceiver output 108, and the outputs 408a and 408b are connected to primary ports A and B, respectively, of the primary winding 104 of the balun 102.

Figure 5:
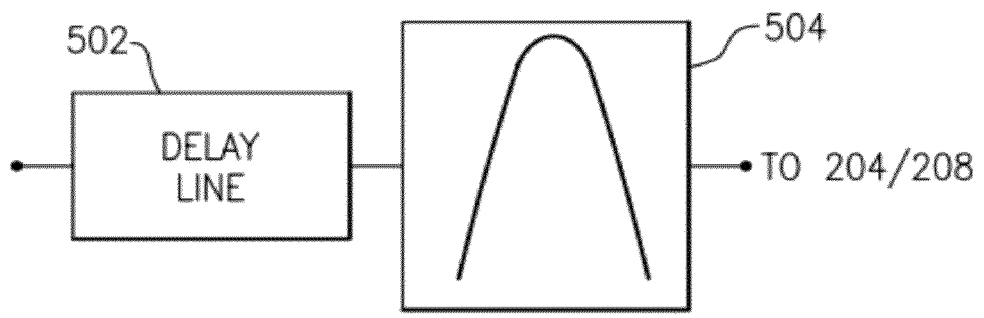
FIG. 5 is a diagram of another example of a filtering network which may be used in the RF interface of FIG. 2.

According to another embodiment, the balun signal splitter illustrated in FIG. 2 can be used in a dual-band WCMDA system. In this embodiment, the high-band and low-band networks 202, 206 may be implemented using interstage filters and delay lines. In this embodiment, the primary impedance matching network 110 may again be implemented using the circuit illustrated in FIG. 4. Referring to FIG. 5, there is illustrated an example of a network 500 which may be used to implement the high-band and low-band networks 202, 206, respectively. The network 500 comprises a delay line 502 coupled to an interstage filter 504. The interstage filter 504 may be configured to have a desired transfer function for a selected operating frequency range. In one embodiment, the delay line 502 is used to transform the out-of-band impedance of the interstage filter 504 to a short circuit. Thus, referring again to FIG. 2, in the high-band network 202, the delay line 502 is used to transform the impedance of the interstage filter 504 to present a short circuit at port C of the secondary winding 106 at low frequencies, whereas in the low-band network 206, the delay line 502 is used to transform the impedance of the interstage filter 504 to present a short circuit at port D of the secondary winding 106 at high frequencies.

It is to be appreciated that balun 102 may also be used in systems that use a communications standard other than GSM or WCDMA and that have different high-band and low-band frequency ranges. The examples given herein are for illustration only and not intended to be limiting.

Referring to FIG. 6, there is illustrated another example of an RF interface incorporating a balun signal splitter according to aspects of the invention. A balun signal splitter such as that illustrated in FIG. 6 may be used, for example, in the transmit section of a GSM communications system. In the illustrated example, the secondary winding 106 of the balun 102 is coupled to a high-band power amplifier monolithic microwave integrated circuit (MMIC) 602 and a low-band power amplifier MMIC 604. Each of the high-band power amplifier MMIC 602 and low-band power amplifier MMIC 604 includes a switch 606a and 606b, respectively, and an amplifier stage 608a, 608b, respectively. The output signal from the high-band power amplifier MMIC 602 is provided at signal output 610, and the output signal from the low-band power amplifier MMIC 604 is provided at signal output 612. In the illustrated example, the switch 606a is used to selectively shunt the signal provided at port C of the secondary winding 106 to ground (for low-band operation), and the switch 606b is used to selectively shunt the signal provided at port D of the secondary winding 106 to ground (for high-band operation). Alternatively, by connecting the switch 606a in-line with between the port C of the secondary winding 106 and the input of the corresponding power amplifier MMIC 602, the switch 606a may be used to selectively couple port C of the secondary winding 106 either to the input of the high-band amplifier stage 608a or to ground. Similarly, switch 606b may be connected in-line and used to selectively couple port D of the secondary winding 106 either to the input of the low-band amplifier stage 608b or to ground.

According to one embodiment, a high-band control signal on line 614 which is used to turn the amplifier stage 608a of the high-band power amplifier MMIC 602 ON and OFF is also used to control the switch 606b in the low-band power amplifier MMIC 604. For example, when the high-band power amplifier MMIC 602 is ON, the high-band control signal on line 614 actuates the switch 606b to shunt the signal provided at port D of the balun 102 to ground. Thus, when the high-band power amplifier MMIC 602 is in the ON mode, the low-band power amplifier MMIC 604 presents a short circuit impedance at port D of the balun 102, and the system is configured for high-band operation. Similarly, a low-band control signal on line 616 can be used to both to turn the amplifier stage 608b of the low-band power amplifier MMIC 604 ON and OFF and to actuate the switch 606a in the high-band power amplifier MMIC 602. When the low-band power amplifier MMIC 604 is in the ON mode and the system is configured for low-band operation, the low-band control signal on line 616 may actuate the switch 606a in the high-band power amplifier MMIC 602 to couple port C of the balun 102 to ground, such that the high-band power amplifier MMIC 602 presents a short circuit impedance at port C. In one example, the high-band and low-band control signals operate together such that the when the system is configured for high-band operation, the amplifier stage 608a is ON and the low-band power amplifier MMIC 604 presents a short circuit impedance at port D, and vice versa.

In conventional systems in which switching an RF signal between a high-band power amplifier and a low-band power amplifier is required, a series switching device, such as a pseudomorphic high electron mobility transistor (PHEMT), is used. By contrast, in the exemplary interface illustrated in FIG. 6, neither switch 606a nor 606b is used to "redirect" the RF signal between alternate (high-band or low-band) outputs. Rather, the switches 606a, 606b either allow the RF signal from the secondary winding 106 through to the respective power amplifier MMIC 602 or 604, or ground the respective port C or D. Accordingly, a series switching device such as a PHEMT is not required. The switches 606a, 606b may be implemented using diodes, such as the diodes that can be provided in a standard heterojunction bipolar transistor (HBT) processes.

Referring to FIG. 7, there is illustrated another example of an RF interface incorporating a balun signal splitter to split a signal between two different modes of operation, such as, for example, a GSM mode and a WCDMA mode. It is to be appreciated that although this example is discussed in terms of a dual-mode GSM/WCDMA system, the balun signal splitter may be used to split an input signal among any of a variety of different modes, not limited to GSM and WCDMA. In the example illustrated in FIG. 7, port C of the secondary winding 106 of the balun 102 is coupled to a GSM power amplifier MMIC 702 and port D of the secondary winding is coupled to a WCDMA power amplifier MMIC 704. As discussed above in respect to the dual-band system illustrated in FIG. 6, each of the power amplifier MMICs 702, 704 includes a switch 706a, 706b, respectively, and an amplifier stage 708a, 708b, respectively. The output signals from the power amplifier MMICs 702, 704 are respectively provided at signal outputs 710 and 712.

Similar to the example discussed above with reference to FIG. 6, the switch 706a may be used to selectively shunt the signal provided at port C of the secondary winding 106 to ground (for WCDMA operation), and the switch 706b may be used to selectively shunt the signal provided at port D of the secondary winding 106 to ground (for GSM operation). Alternatively, by connecting the switches 706a, 706b in-line between the ports of the secondary winding 106 and the respective inputs of the power amplifier MMICs 702, 704, the switches may be used to selectively couple the ports to either the input of the respective power amplifier MMIC or to ground, as discussed above.

According to one embodiment, a GSM control signal on line 714 which is used to turn the amplifier stage 708a of the GSM power amplifier MMIC 702 ON and OFF is also used to control the switch 706b in the WCDMA power amplifier MMIC 704. For example, when the GSM power amplifier MMIC 702 is ON, the GSM control signal on line 714 actuates the switch 706b to shunt the signal provided at port D of the balun 102 to ground. Thus, when the GSM power amplifier MMIC 702 is in the ON mode, the WCDMA power amplifier MMIC 704 presents a short circuit impedance at port D of the balun 102, and the system is configured for GSM operation. Similarly, a WCDMA control signal on line 716 can be used to both to turn the amplifier stage 708b of the WCDMA power amplifier MMIC 704 ON and OFF and to actuate the switch 706a in the GSM power amplifier MMIC 702 to configure the system for WCDMA operation. In one example, the GSM and WCDMA control signals operate together such that the when the system is configured for GSM operation, the amplifier stage 708a is ON and the WCDMA power amplifier MMIC 704 presents a short circuit impedance at port D, and vice versa. As discussed above with reference to FIG. 6, in the example illustrated in FIG. 7, the switches 706a and 706b are used to either pass the RF signal to the respective amplifier input or ground the respective port C or D of the secondary winding rather than to "re-direct" the RF signal between alternate outputs (GSM or WCDMA). Accordingly, the switches 706a, 706b may be implemented using diodes rather than PHEMT switches.

Figure 8:
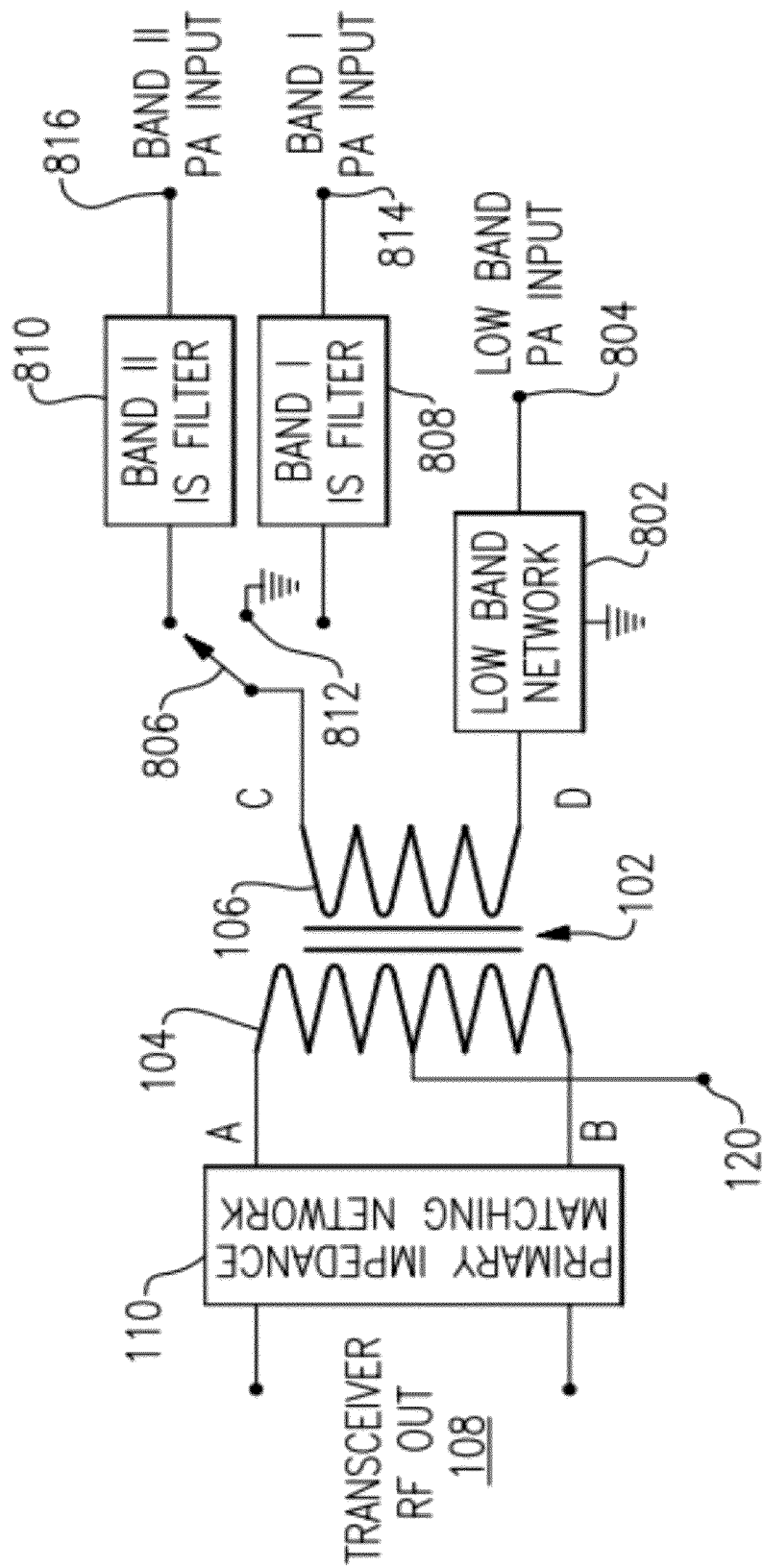
FIG. 8 is a block diagram of an example of a tri-mode RF interface including an RF balun signal splitter according to aspects of the invention.

Referring to FIG. 8 there is illustrated another example of a balun signal splitter. This balun signal splitter may be used, for example, in a tri-mode WCDMA communications system. The balun signal splitter includes a low-band network 802 coupled between port D of the secondary winding 106 and a low-band power amplifier input terminal 804. In the illustrated example, port C of the secondary winding 106, rather than being connected to a corresponding high-band network as discussed above, is instead coupled to a switch 806 that directs the signal at port C to one of a first interstage filter 808, a second interstage filter 810, or a ground terminal 812. The two interstage filters 810 may be configured for different operating frequency bands (e.g., band I for filter 808 and band II for filter 810) of the communications system in which the balun signal splitter is used. Accordingly, the band I interstage filter 808 may be coupled to a band I power amplifier input terminal 814 and the band II interstage filter 810 may be coupled to a band II power amplifier input terminal 816, as illustrated in FIG. 8.

In one exemplary embodiment, the switch 806 is a single-pole, triple-throw (SP3T) switch. For low-band transmission, the switch 806 may be actuated to couple port C of the secondary winding 106 to the ground terminal 812. The low-band network may be implemented in a variety of ways, including, for example, using the circuits illustrated in FIG. 3 or FIG. 5, or variations thereof. According to one embodiment, the low-band network is configured to present a short circuit impedance at port D of the secondary winding 106 at high frequencies, as discussed above.

Embodiments of the balun signal splitter may be used in many different wireless communications systems, as well as in other transceiver systems where it is desirable to split a signal for two or more different operating modes or frequency bands. As discussed above, the balun signal splitter may provide many benefits, including reduced RF routing, reduced area for routing and balun placement or integration, reduced transceiver die area, and reduced transceiver package pin count and package size. These reductions in turn may advantageously result in reduced manufacturing cost of the transceiver.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

The invention claimed is:

1. A balun signal splitter configured for high-band and low-band operation, the balun signal splitter comprising:
   a balun including a primary winding and a secondary winding, each having a first port and a second port;
   a high-band network coupled to the first port of the secondary winding and configured to present a short circuit impedance at the first port of the secondary winding at low-band frequencies; and
   a low-band network coupled to the second port of the secondary winding and configured to present a short circuit impedance at the second port of the secondary winding at high-band frequencies.

2. The balun signal splitter of claim 1 wherein at least one of the high-band network and the low-band network includes a resonant circuit including an inductance coupled between a first capacitance and a second capacitance.

3. The balun signal splitter of claim 1 wherein at least one of the high-band network and the low-band network includes a delay line coupled to an interstage filter.

4. The balun signal splitter of claim 3 wherein the delay line is configured to transform an out-of-band impedance of the interstage filter to a short circuit.

5. The balun signal splitter of claim 1 further comprising a primary impedance matching network coupled to the first and second ports of the primary winding of the balun.

6. The balun signal splitter of claim 5 wherein the primary impedance matching network is a passive network.

7. The balun signal splitter of claim 5 wherein the primary impedance matching network is configured to present a high-Z real differential impedance at the first and second ports of the primary winding.

8. The RF interface of claim 1 wherein the low-band frequencies include frequencies in the range of 820 MHz to 915 MHz.

9. The balun signal splitter of claim 1, wherein the high-band frequencies include frequencies in the range of 1710 MHz to 1910 MHz.

10. An RF interface for a transceiver, the RF interface comprising:
- a balun signal splitter configured for high-band and low-band operation and including:
  - a balun including a primary winding and a secondary winding, each having a first port and a second port;
  - a high-band network coupled to the first port of the secondary winding and configured to present a short circuit impedance at the first port of the secondary winding at low-band frequencies; and
  - a low-band network coupled to the second port of the secondary winding and configured to present a short circuit impedance at the second port of the secondary winding at high-band frequencies;
- a differential transceiver RF output terminal coupled to the primary winding of the balun;
- a first power amplifier input terminal; and
- a second power amplifier input terminal, the high-band network being coupled between the first port of the secondary winding and the first power amplifier input terminal, and the low-band network being coupled between the second port of the secondary winding and the second power amplifier input terminal.

11. The RF interface of claim 10 wherein the transceiver is incorporated into a dual-band communications system.

12. The RF interface of claim 11 wherein the dual-band communications system is one of a dual-band WCDMA communications system and a dual-band GSM communications system.

13. A balun signal splitter configured for dual-mode operation, the balun signal splitter comprising:
- a balun including a primary winding and a secondary winding, each having a first port and a second port;
- a first network coupled to the first port of the secondary winding and configured to present a short circuit impedance at the first port of the secondary winding for a first mode of operation; and
- a second network coupled to the second port of the secondary winding and configured to present a short circuit impedance at the second port of the secondary winding for a second mode of operation.

14. The balun signal splitter of claim 13 wherein the dual-mode operation includes operation in at least two operating frequency bands, and the first mode of operation is high-band operation and the second mode of operation is low-band operation.

15. The balun signal splitter of claim 13 wherein the first mode of operation includes a GSM mode and the second mode of operation includes a WCDMA mode.

16. The balun signal splitter of claim 13 wherein at least one of the first network and the second network includes a delay line coupled to an interstage filter.

17. The balun signal splitter of claim 16 wherein the delay line is configured to transform an out-of-mode impedance of the interstage filter to a short circuit.

18. The balun signal splitter of claim 13 further comprising a primary impedance matching network coupled to the first and second ports of the primary winding of the balun.

19. The balun signal splitter of claim 18 wherein the primary impedance matching network is a passive network.

20. The balun signal splitter of claim 18 wherein the primary impedance matching network is configured to present a high-Z real differential impedance at the first and second ports of the primary winding.

21. An RF interface for a transceiver for a wireless communications system, the RF interface comprising:
- a differential transceiver output terminal;
- a balun including a primary winding having first and second primary ports coupled to the differential transceiver output terminal and a secondary winding having first and second secondary ports;
- first and second power amplifier input terminals;
- a first network electrically coupled between the first secondary port and the first power amplifier input terminal, the first network configured to present a short circuit out-of-band impedance at the first port for a first mode of operation; and
- a second network electrically coupled between the second secondary port and the second power amplifier input terminal, the second network configured to present a short circuit out-of-band impedance at the second port for a second mode of operation.

22. The RF interface of claim 21 wherein the first network is a high-band network and the second network is a low-band network.

23. The RF interface of claim 21 wherein the first network is a GSM network and the first mode of operation is a GSM mode, and second network is a WCDMA network and the second mode of operation is a WCDMA mode.

* * * * *

UNITED STATES PATENT AND TRADEMARK OFFICE
CERTIFICATE OF CORRECTION

PATENT NO. : 8,264,297 B2
APPLICATION NO. : 12/671332
DATED : September 11, 2012
INVENTOR(S) : Philip H. Thompson It is certified that error appears in the above-identified patent and that said Letters Patent is hereby corrected as shown below:

In the Claims:

In column 12, claim 23, line 51, "and second network" should be replaced with --and the second network--.

Signed and Sealed this
Twentieth Day of November, 2012

David J. Kappos
*Director of the United States Patent and Trademark Office*